(12) United States Patent
Moon et al.

(10) Patent No.: US 10,825,491 B2
(45) Date of Patent: Nov. 3, 2020

(54) SYSTEMS AND METHODS FOR WRITING ZEROS TO A MEMORY ARRAY

(71) Applicant: Micron Technology, Inc., Boise, ID (US)

(72) Inventors: Byung S. Moon, Plano, TX (US); Gary L. Howe, Plano, TX (US); Harish N. Venkata, Allen, TX (US); David R. Brown, Lucas, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/837,666

(22) Filed: Dec. 11, 2017

(65) Prior Publication Data

US 2019/0179552 A1    Jun. 13, 2019

(51) Int. Cl.
| | | |
|---|---|---|
| *G11C 7/10* | (2006.01) | |
| *G11C 11/4072* | (2006.01) | |
| *G11C 8/04* | (2006.01) | |
| *G11C 11/408* | (2006.01) | |
| *G11C 7/20* | (2006.01) | |
| *G06F 12/06* | (2006.01) | |
| *G06F 11/10* | (2006.01) | |
| G11C 29/52 | (2006.01) | |
| G11C 29/02 | (2006.01) | |
| G11C 29/46 | (2006.01) | |

(52) U.S. Cl.
CPC ........ *G11C 7/1018* (2013.01); *G06F 11/1048* (2013.01); *G06F 12/06* (2013.01); *G11C 7/20* (2013.01); *G11C 8/04* (2013.01); *G11C 11/408* (2013.01); *G11C 11/4072* (2013.01); *G06F 11/1068* (2013.01); *G11C 29/022* (2013.01); *G11C 29/028* (2013.01); *G11C 29/46* (2013.01); *G11C 29/52* (2013.01)

(58) Field of Classification Search
CPC ............... G06F 3/0632; G11C 11/4091; G11C 11/4072
See application file for complete search history.

(56) References Cited

U.S. PATENT DOCUMENTS

| | | | |
|---|---|---|---|
| 6,317,852 B1 | 11/2001 | Lau et al. | |
| 6,580,644 B1* | 6/2003 | Chung | G11C 16/30 365/185.09 |
| 2005/0022065 A1* | 1/2005 | Dixon | G06F 11/106 714/42 |
| 2015/0378615 A1 | 12/2015 | Ramanujan et al. | |
| 2016/0284390 A1 | 9/2016 | Tomishima et al. | |
| 2017/0092342 A1 | 3/2017 | Shigeki et al. | |
| 2017/0255406 A1 | 9/2017 | Tomishima et al. | |
| 2018/0181344 A1 | 6/2018 | Tomishima et al. | |

OTHER PUBLICATIONS

PCT International Search Report & Written Opinion for PCT Application No. PCT/US2018/044867 dated Nov. 14, 2018; 15 Pages.

* cited by examiner

*Primary Examiner* — Nathan Sadler
(74) *Attorney, Agent, or Firm* — Fletcher Yoder, P.C.

(57) ABSTRACT

A memory device may include a memory array, which may also include, multiple memory cells. The memory device may also include one or more counters designed to generate internal memory addresses to sequentially access the memory cells and facilitate writing logical zeros to all of the memory cells.

19 Claims, 7 Drawing Sheets

SYSTEMS AND METHODS FOR WRITING ZEROS TO A MEMORY ARRAY

BACKGROUND

Embodiments described herein relate generally to the field of memory devices. More specifically, the current embodiments include one or more systems, devices, and methods for utilizing address counters for writing zeros to a memory array.

DESCRIPTION OF RELATED ART

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Various modes of operation in memory devices may require access to large sections or all of the memory array on the memory device. For example, in certain instances, such as testing, the memory device may be set to a mode such that each memory cell of the memory array may be individually accessed. The accessing of each memory cell in certain modes of operation may be an iterative process such that each of the memory cells in the memory array is sequentially accessed. In order to facilitate such functionality, it may be desirable to provide fast and efficient methods and structures for allowing access to each memory cell in a sequential manner. Further, such sequential access should be provided without necessitating the usage of extra hardware components which may increase cost of the memory device and increase the size of the memory device. Accordingly, embodiments described herein may be directed to one or more of the problems set forth above.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As is described in detail below, it may be desirable to read/write a specific set or pattern of logic (e.g., 1s and 0s) in a memory array. In doing so, memory devices may employ modes of operation that facilitate sequential access to all memory cells or large blocks of memory cells in a memory array. For instance, in double data rate type five synchronous dynamic random access memory (DDR5 SDRAM), certain modes of operation (e.g., Fast Zero mode, Error, Check and Scrub (ECS) mode, etc.) provide that each cell of the memory array is sequentially accessed. As will be appreciated, sequential access may be characterized by any rational sequence (e.g., [0, 1, 2, 3 . . . ], [1, 3, 5, 7 . . . ], etc.).

In one embodiment, Fast Zero mode may be utilized to quickly write logical zeros to all or part of the memory array with or without using an input/output interface for each write. In order to sequentially access each memory cell, one or more commands may be received by the memory device. Controllers in the memory device may be used to generate internal memory addresses such that each cell can be individually accessed. One or more counters may be used to sequence through internal addresses to access each memory cell of the array.

Figure 1:
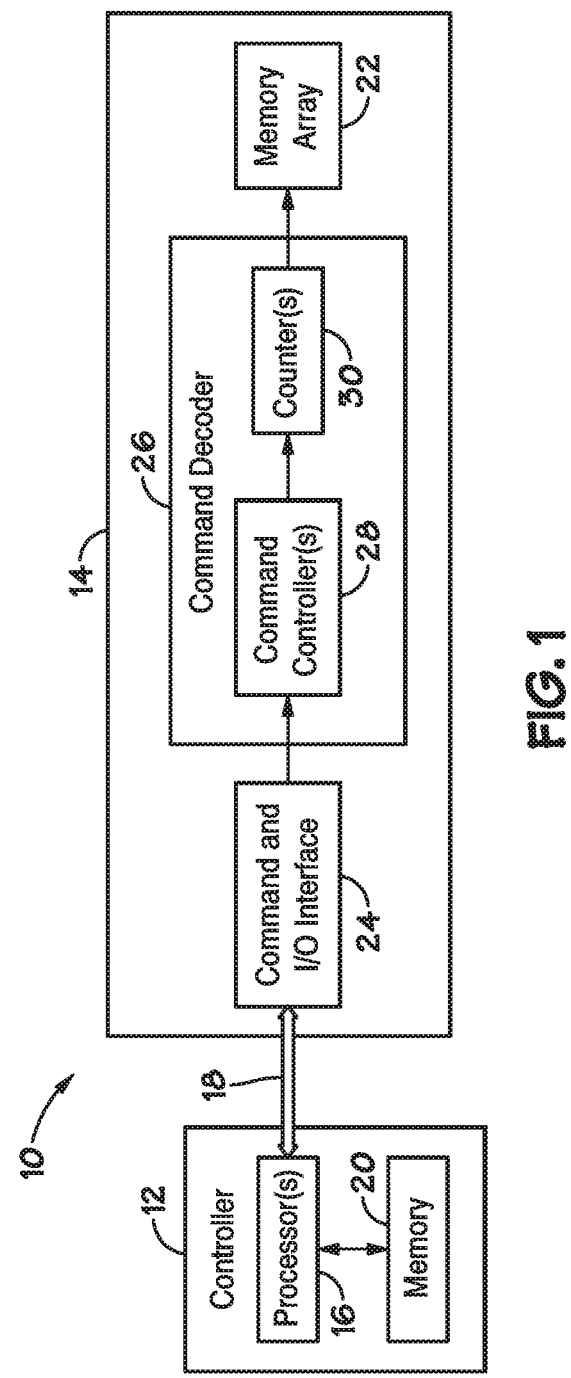
FIG. 1 is a block diagram illustrating a computer system, in accordance with an embodiment of the present disclosure.

Referring now to FIG. 1, a simplified block diagram of a computer system 10, which may provide for such sequential access of a memory device, is illustrated. The computer system 10 includes a controller 12 and a memory device 14. The controller 12 may include processing circuitry, such as one or more processors 16 (e.g., one or more microprocessors), that may execute software programs to provide various signals to the memory device 14 over one or more bi-directional communication buses 18 to facilitate the transmission and receipt of data to be written to or read from the memory device 14. Moreover, the processor(s) 16 may include multiple microprocessors, one or more "general-purpose" microprocessors, one or more special-purpose microprocessors, and/or one or more application specific integrated circuits (ASICS), or some combination thereof. For example, the processor(s) 16 may include one or more reduced instruction set (RISC) processors.

The processor(s) 16 may be coupled to one or more memories 20 that may store information such as control logic and/or software, look up tables, configuration data, etc. In some embodiments, the processor(s) 16 and/or the memory 20 may be external to the controller 12. The memory 20 may include a tangible, non-transitory, machine-readable-medium, such as a volatile memory (e.g., a random access memory (RAM)) and/or a nonvolatile memory (e.g., a read-only memory (ROM), flash memory, a hard drive, or any other suitable optical, magnetic, or solid-state storage medium, or a combination thereof). The memory 20 may store a variety of information and may be used for various purposes. For example, the memory 20 may store machine-readable and/or processor-executable instructions (e.g., firmware or software) for the processor(s) 16 to execute, such as instructions for providing various signals and commands to the memory device 14 to facilitate the transmission and receipt of data to be written to or read from the memory device 14.

The memory device 14 includes a memory array 22 of individual memory cells. As described further below, the memory array 22 may include one or more memory banks that may be grouped or partitioned in a variety of ways to provide access to the cells of the memory array 22, as described below. The controller 12 may communicate with the memory device 14 through one or more command and input/output (I/O) interfaces 24. In general, the command and input/output interfaces 24 provide access to various components of the memory device 14 by external devices, such as the controller 12.

The memory device 14 may include a command decoder 26. The command decoder 26 may receive command signals from the command and input/output (110) interfaces 24 and may decode the command signals to provide various internal commands. For instance, the command decoder 26 may decode commands, such as read commands, write commands, mode-register set commands, activate commands, etc., and provide access to specified regions of the memory array 22. As described above, certain modes of operation, such as the Fast Zero mode, may facilitate sequential access to individual cells of the memory array 22. To facilitate this functionality, the command decoder 26 includes a command controller 28 that includes one or more individual controllers to control the address sequencing when a particular mode command (e.g., Fast Zero command) is received. Further, in order to generate internal addresses to be accessed sequentially, one or more counters 30 may also be provided. Because additional counters 30 may increase the cost and/or size of the memory device 14, it may be advantageous, in some embodiments of the Fast Zero mode, to share the same counters 30 with other modes of operation to minimize the additional hardware used to generate the address sequencing to access the memory array 22. It should be noted that while the command controller 28 and counters 30 are illustrated as being part of the command decoder 26, alternatively, these elements may be provided elsewhere on the memory device 14.

Figure 2:
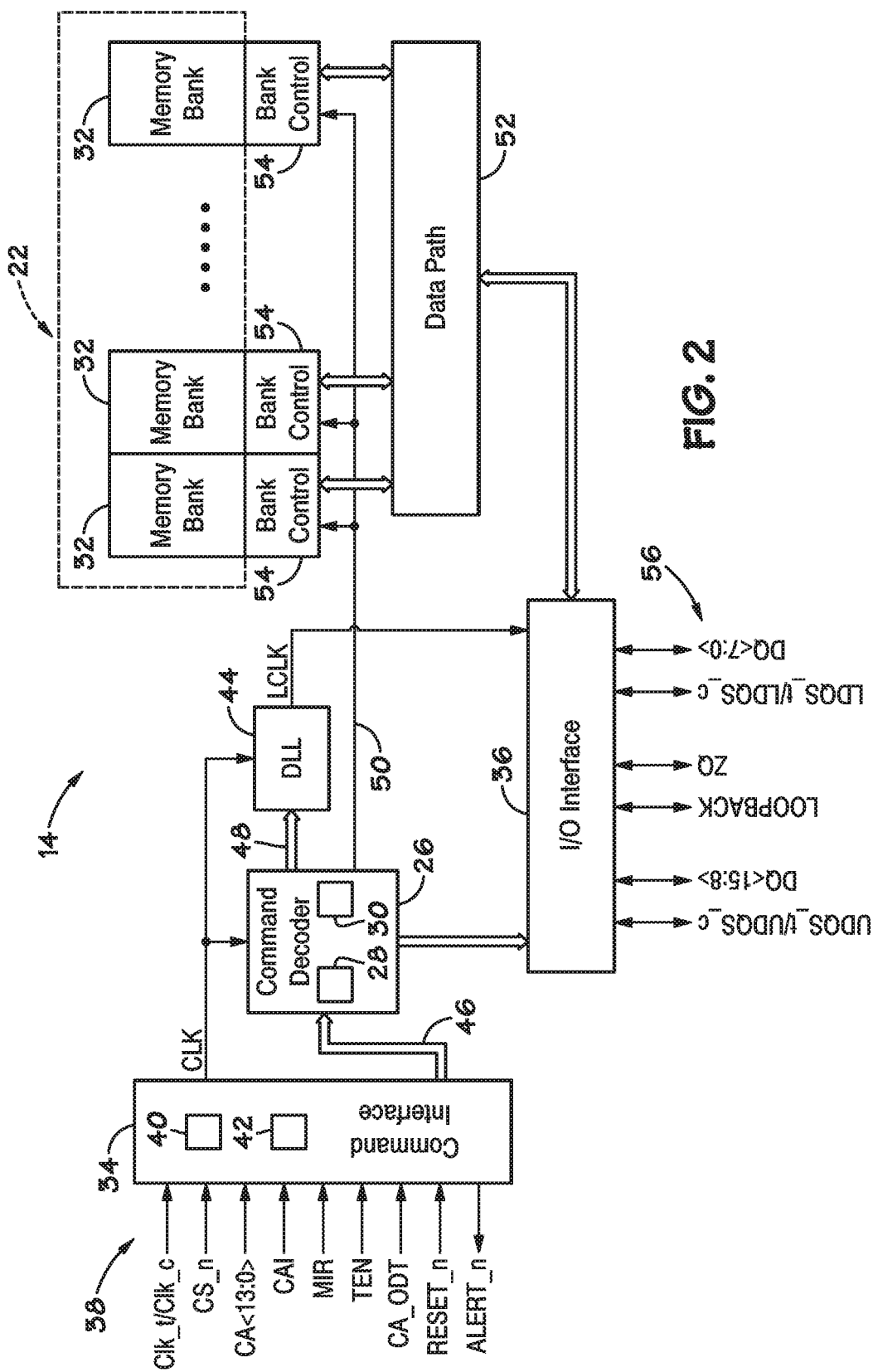
FIG. 2 is a block diagram illustrating a memory device, in accordance with an embodiment of the present disclosure.

The block diagram of FIG. 2 is a functional block diagram illustrating certain additional features and related functionality of the memory device 14. In accordance with one embodiment, the memory device 14 may be a double data rate type five synchronous dynamic random access memory (DDR5 SDRAM) device. Various features of DDR5 SDRAM allow for reduced power consumption, more bandwidth, and more storage capacity compared to prior generations of DDR SDRAM.

The memory device 14, may include a memory array 22 logically and functionally grouped into a number of memory banks 32. The memory banks 32 may be DDR5 SDRAM memory banks, for instance. The memory banks 32 may be provided on one or more chips (e.g., SDRAM chips) that are arranged on dual inline memory modules (DIMMS). Each DIMM may include a number of SDRAM memory chips (e.g., ×8 or ×16 memory chips). Each SDRAM memory chip may include one or more memory banks 32. The memory device 14 represents a portion of a single memory chip (e.g., SDRAM chip) having a number of memory banks 32. For DDR5, the memory banks 32 may be further arranged to form bank groups. For instance, for an 8 gigabit (Gb) DDR5 SDRAM, the memory chip may include 16 memory banks 32, arranged into 8 bank groups, each bank group including 2 memory banks. For a 16 Gb DDR5 SDRAM, the memory chip may include 32 memory banks 32, arranged into 8 bank groups, each bank group including 4 memory banks, for instance. Various other configurations, organization and sizes of the memory banks 32 on the memory device 14 may be utilized depending on the application and design of the overall system.

As previously described, the memory device 14 may include a command interface 34 and an input/output (I/O) interface 36. The command interface 34 is configured to provide a number of signals (e.g., signals 38) from an external device, such as a processor 16 or controller 12. The processor 16 or controller 12 may provide various signals 38 over one or more bi-directional data buses (e.g., data bus 18) to and from the memory device 14 to facilitate the transmission and receipt of data to be written to or read from the memory device 14.

As will be appreciated, the command interface 34 may include a number of circuits, such as a clock input circuit 40 and a command address input circuit 42, for instance, to ensure proper handling of the signals 38. The command interface 34 may receive one or more clock signals from an external device. Generally, double data rate (DDR) memory utilizes a differential pair of system clock signals, referred to herein as the true clock signal (Clk_t) and the complementary clock signal (Clk_c). The positive clock edge for DDR refers to the point where the rising true clock signal Clk_t crosses the falling complementary clock signal Clk_c, while the negative clock edge indicates that transition of the falling true clock signal Clk_t and the rising of the complementary clock signal Clk_c. Commands (e.g., read command, write command, etc.) are typically entered on the positive edges of the clock signal and data is transmitted or received on both the positive and negative clock edges.

The clock input circuit 40 receives the true clock signal (Clk_t) and the complementary clock signal (Clk_c) and generates an internal clock signal CLK. The internal clock signal CLK is supplied to an internal clock generator 44, such as a delay locked loop (DLL) circuit. The internal clock generator 44 generates a phase controlled internal clock signal LCLK based on the received internal clock signal CLK. The phase controlled internal clock signal LCLK is supplied to the I/O interface 36, for instance, and is used as a timing signal for determining an output timing of read data.

The internal clock signal CLK may also be provided to various other components within the memory device 14 and may be used to generate various additional internal clock signals. For instance, the internal clock signal CLK may be provided to a command decoder 26. The command decoder 26 may receive command signals from the command bus 50 and may decode the command signals to provide various internal commands. For instance, the command decoder 26 may provide command signals to the internal clock generator 44 over the bus 48 to coordinate generation of the phase controlled internal clock signal LCLK. The phase controlled internal clock signal LCLK may be used to clock data through the I/O interface 36, for instance.

Further, the command decoder 26 may decode commands, such as read commands, write commands, activate commands, mode-register set commands (e.g., Fast Zero commands, ECS commands, etc.), and provide access to a particular memory bank 32 corresponding to the command, via the bus path 52. As will be appreciated, the memory device 14 may include various other decoders, such as row decoders and column decoders, to facilitate access to the memory banks 32. In one embodiment, each memory bank 32 includes a bank control block 54 which provides the necessary decoding (e.g., row decoder and column decoder), as well as other features, such as timing control and data control, to facilitate the execution of commands to and from the memory banks 32.

As previously described with regard to FIG. 1, the command decoder 26 may include one or more command controllers 28 to facilitate certain functions, such as implementation of the Fast Zero mode. In addition, the command decoder 26 may include one or more counters 30 that may be utilized under control of the command controller(s) 28 to generate internal addresses for sequential access of cells of the individual storage locations within each memory bank 32.

The memory device 14 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 34 using the clock signals (Clk_t and Clk_c). The command interface 34 may include a command address input circuit 42 which is configured to receive and transmit the commands to provide access to the memory banks 32, through the command decoder 26, for instance. In addition, the command interface 34 may receive a chip select signal (CS_n). The CS_n signal enables the memory device 14 to process commands on the incoming CA<13:0> bus. Access to specific banks 32 within the memory device 14 is encoded on the CA<13:0> bus with the commands.

In addition, the command interface 34 may be configured to receive a number of other command signals. For instance, a command/address on die termination (CA_ODT) signal may be provided to facilitate proper impedance matching within the memory device 14. A reset command (RESET_n) may be used to reset the command interface 34, status registers, state machines and the like, during power-up for instance. The command interface 34 may also receive a command/address invert (CAI) signal which may be provided to invert the state of command/address signals CA<13:0> on the command/address bus, for instance, depending on the command/address routing for the particular memory device 14. A mirror (MIR) signal may also be provided to facilitate a mirror function. The MIR signal may be used to multiplex signals so that they can be swapped for enabling certain routing of signals to the memory device 14, based on the configuration of multiple memory devices in a particular application. Various signals to facilitate testing of the memory device 14, such as the test enable (TEN) signal, may be provided, as well. For instance, the TEN signal may be used to place the memory device 14 into a test mode for connectivity testing.

The command interface 34 may also be used to provide an alert signal (ALERT_n) to the system processor or controller for certain errors that may be detected. For instance, an alert signal (ALERT_n) may be transmitted from the memory device 14 if a cyclic redundancy check (CRC) error is detected. Other alert signals may also be generated. Further, the bus and pin for transmitting the alert signal (ALERT_n) from the memory device 14 may be used as an input pin during certain operations, such as the connectivity test mode executed using the TEN signal, as described above.

Data may be sent to and from the memory device 14, utilizing the command and clocking signals discussed above, by transmitting and receiving data signals 56 through the I/O interface 36. More specifically, the data may be sent to or retrieved from the memory banks 32 over the data path 52, which includes a plurality of bi-directional data buses. Data I/O signals, generally referred to as DQ signals, are generally transmitted and received in one or more bi-directional data busses. For certain memory devices, such as a DDR5 SDRAM memory device, the I/O signals may be divided into upper and lower bytes. For instance, for a ×16 memory device, the I/O signals may be divided into upper and lower I/O signals (e.g., DQ<15:8> and DQ<7:0>) corresponding to upper and lower bytes of the data signals, for instance.

To allow for higher data rates within the memory device 14, certain memory devices, such as DDR memory devices may utilize data strobe signals, generally referred to as DQS signals. The DQS signals are driven by the external processor or controller sending the data (e.g., for a write command) or by the memory device 14 (e.g., for a read command). For read commands, the DQS signals are effectively additional data output (DQ) signals with a predetermined pattern. For write commands, the DQS signals are used as clock signals to capture the corresponding input data. As with the clock signals (Clk_t and Clk_c), the data strobe (DQS) signals may be provided as a differential pair of data strobe signals (DQS_t and DQS_c) to provide differential pair signaling during reads and writes. For certain memory devices, such as a DDR5 SDRAM memory device, the differential pairs of DQS signals may be divided into upper and lower data strobe signals (e.g., UDQS_t and UDQS_c; LDQS_t and LDQS_c) corresponding to upper and lower bytes of data sent to and from the memory device 14, for instance.

An impedance (ZQ) calibration signal may also be provided to the memory device 14 through the I/O interface 36. The ZQ calibration signal may be provided to a reference pin and used to tune output drivers and ODT values by adjusting pull-up and pull-down resistors of the memory device 14 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 14 and GND/VSS external to the memory device 14. This resistor acts as a reference for adjusting internal ODT and drive strength of the IO pins.

In addition, a loopback signal (LOOPBACK) may be provided to the memory device 14 through the I/O interface 36. The loopback signal may be used during a test or debugging phase to set the memory device 14 into a mode wherein signals are looped back through the memory device 14 through the same pin. For instance, the loopback signal may be used to set the memory device 14 to test the data output (DQ) of the memory device 14. Loopback may include both a data and a strobe or possibly just a data pin. This is generally intended to be used to monitor the data captured by the memory device 14 at the I/O interface 36.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 14), etc., may also be incorporated into the memory system 10. Accordingly, it should be understood that the block diagram of FIG. 2 is only provided to highlight certain functional features of the memory device 14 to aid in the subsequent detailed description.

Figure 3:
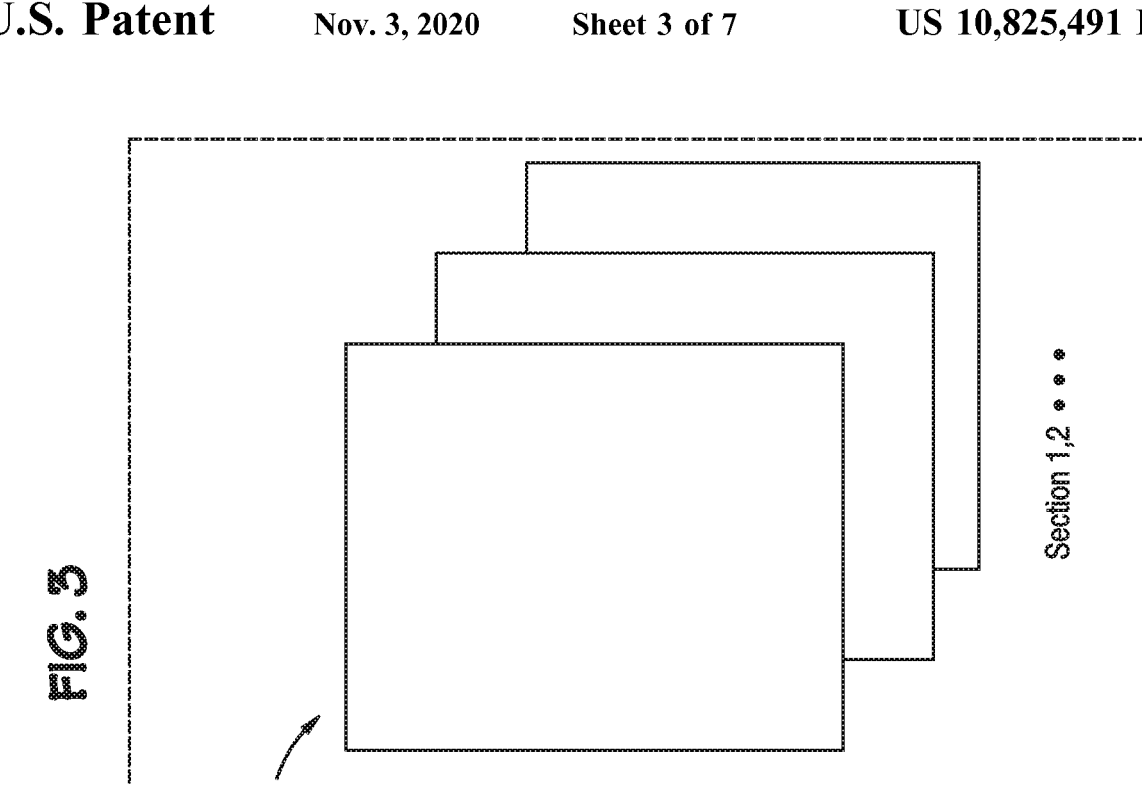
FIG. 3 is a schematic diagram of a portion of the memory device of FIG. 2, in accordance with an embodiment of the present disclosure.

In some embodiments, the memory banks 32 may be divided into one or more sections 60, as shown in FIG. 3. Each section 60 may include a grid of multiple wordlines 62, also known as rows, and bitlines 64, also known as digit lines. The intersection of a wordline 62 and a bitline 64 may then yield an individual memory cell 66 to store a single bit of data. Although logical data (e.g., 1s and 0s) are stored in each memory cell 66 defined by wordlines 62 and bitlines 64, to access the memory cells, each wordline 62 and bitline 64 may be assigned an address. Addresses within a section 60 may include a row address and a columns address. While a row address may include only one row/wordline 62, a column address may include multiple columns 68, which, in turn, may also include multiple bitlines 64. For example, a column 68 may include eight bitlines 64, and a single column address may access sixteen columns 68. As such, 128 memory cells 66 (1×(8×16)) may be identified by the same row and column address. This may be referred to as 16n pre-fetch because sixteen columns 68 may be called upon by single column address. In some embodiments each column 68 may have more or fewer bitlines 64. For example, in one embodiment, each column includes one bitline 64. In such a case, columns 68 and bitlines 64 may be one and the same. Furthermore, in some embodiments, a single column address may access just one column. Therefore, each row and column address may be associated with a single memory cell 66. Although depicted in FIG. 3 with only ten wordlines 62 and two columns 68, as will be appreciated, a section 60 may have any number of rows 62 and columns 68 depending on the application and design of the overall system.

On each bitline 64, a sense amplifier 70 may be used to determine the logical state of a memory cell 66. For example, when a bitline 64 is activated, along with a corresponding wordline 62, the logical state of a memory cell 66 may be read by the sense amplifier 70. The sense amplifier 70 may then compare the read value to a reference value, amplify the difference between the two, and output the determined value of the memory cell 66. As such, the sense amplifier 70 may draw power from a power supply to amplify and hold the read value. Additionally, as illustrated, the sense amplifiers 70 for each bitline 64 may be located physically on alternating sides of the section 60. However, in other embodiments, the sense amplifiers 70 may be located on the same side of the section 60 or elsewhere depending on the application and design of the memory device 14.

Figure 4:
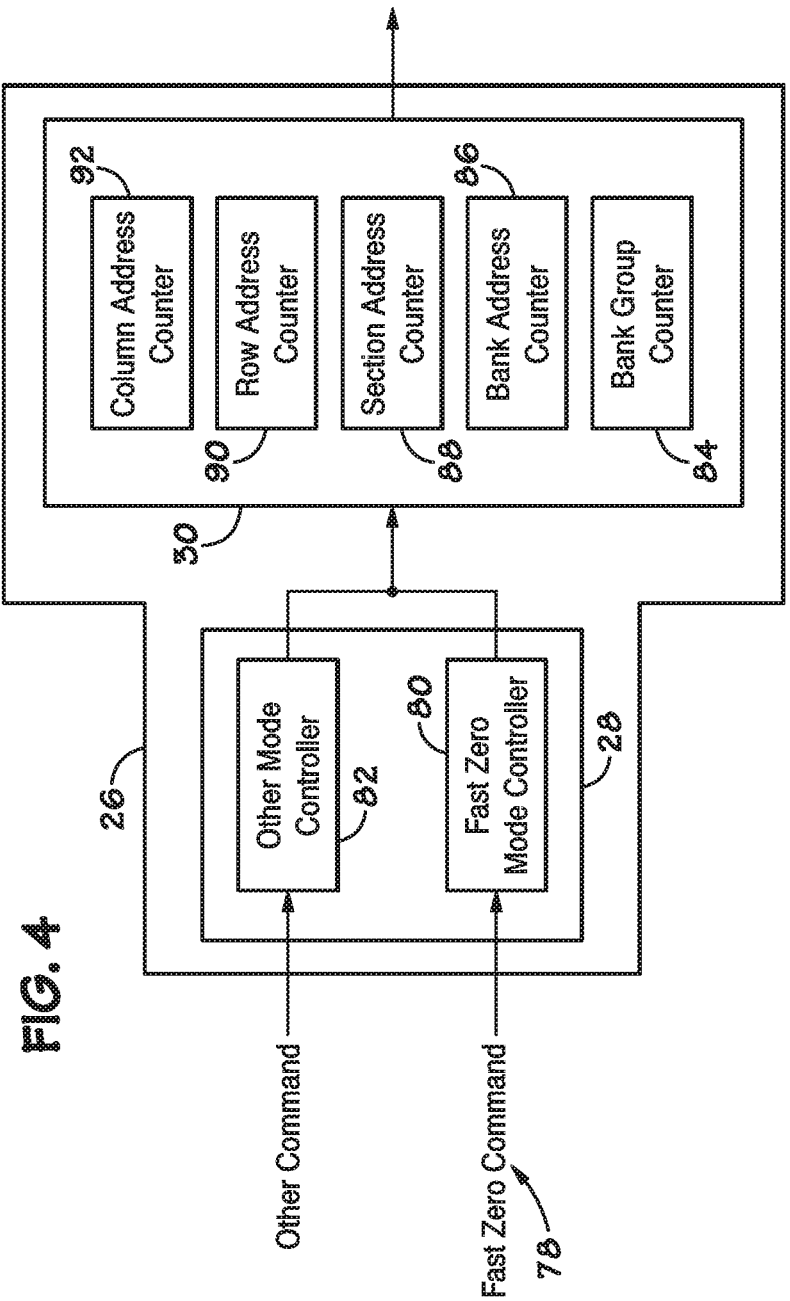
FIG. 4 is a block diagram of a portion of the memory device of FIG. 2, in accordance with an embodiment of the present disclosure.

When implementing the Fast Zero mode, logical 0s may be written to every memory cell 66 of the memory array 22. To facilitate this functionality, the command decoder 26 may include a command controller 28 to receive a Fast Zero command 78, as illustrated in FIG. 4. The command controller 28 may include one or more individual controllers 80 and 82 to control the address sequencing when a particular mode command (e.g., Fast Zero command) is received. In the illustrated embodiment, the command controller 28 includes a Fast Zero mode controller 80 and a secondary other mode controller 82. The Fast Zero mode controller 80 may be implemented alone or in conjunction with multiple other mode controllers. The other mode controller 82 may provide control for one or more additional modes of operation that may be used in the memory device 14, depending on the application.

The Fast Zero command 78 may be asserted by one of the processors 16 in the external controller 12 as part of the device power-up and initialization sequence, for instance. Additionally or alternatively, the Fast Zero mode may be employed as part of an error-correcting code (ECC) implementation. As will be appreciated, a Fast Zero command 78 may be sent at any appropriate time when the writing of 0s to the memory array 22 is desired. Additionally, while the Fast Zero mode of operation is utilized to write logical 0s to multiple memory locations, a similar mode register command may also be used to write other known values to each of the memory locations (e.g., all logical 1s, or a specified and known pattern).

Furthermore, the use of the Fast Zero mode to write logical 0s to all or a portion of the memory array 22 may be significantly faster than a standard write via the I/O interface 36. For example, a standard access to a memory cell 66 may include both read and/or write steps. However, when employing the Fast Zero mode, the read step may be skipped, thus shortening the process time and optimizing system resources (e.g., time). Generally, 0s may be written as regular data, cell-by-cell from incoming data on the I/O interface 36. Thus, writing 0s across the entire memory array 22 may be relatively time consuming, especially for large capacity memory devices 14. However, the Fast Zero mode may allow 0s, or another data pattern, to be repeated internally, using the counters 30 to quickly access and write to each cell, and, therefore, not utilize incoming data on the I/O interface 36 and/or data path 52 for each write. As such, during the Fast Zero mode, the I/O interface 36 and/or data path 52 may be omitted from the write process, or its use minimized.

During the Fast Zero mode, internal memory addresses may be sequentially incremented by counters 30 to access the multiple memory cells 66. In accordance with one embodiment, the counters 30 may include a bank group counter 84, a bank address counter 86, a section address counter 88, a row address counter 90, and a column address counter 92.

In the illustrated embodiment, five counters 30 are provided in order to facilitate the various groupings of memory cells 66 for sequential access. Specifically, a bank group counter 84 is provided to switch from one bank group to another during sequential accessing of the memory array 22. In one embodiment, the memory array 22 may include four bank groups and the bank group counter 84 is a 2-bit counter. A bank address counter 86 may also be provided to switch from one bank to another during access of the memory array 22. In one embodiment, the memory array 22 may include two or four memory banks 32 per one bank group and the bank address counter 86 is a 1-bit or 2-bit counter. In one embodiment, a section address counter 88 may also be implemented to provide switching between sections 60 of a memory bank 32. In one embodiment, each memory bank may include eight sections and the section address counter is a 3-bit counter. A row address counter 90 may also be provided to switch from one wordline 62 to another during sequential accessing of the memory array 22. In one embodiment, the memory array 22 may include 65,536 wordlines and the row address counter 90 is a 16-bit counter. Finally, in the illustrated embodiment, a column address counter 92 may also be provided to switch from one set of column 68 to another during sequential accessing of the memory array 22. In one embodiment, the memory array 22 may include 128 column addresses and the column address counter 92 is a 7-bit counter. In certain embodiments of the memory device 14, it may be that not all of the illustrated counters 30 are utilized. For instance, certain memory devices 14 may only employ one bank group. In such a device, the bank group counter 84 may not be utilized or may be omitted entirely from the memory device 14. Further, in certain embodiment of the memory device 14, additional counters 30 may be employed if other groupings of memory cells 66 are utilized.

Figure 5:
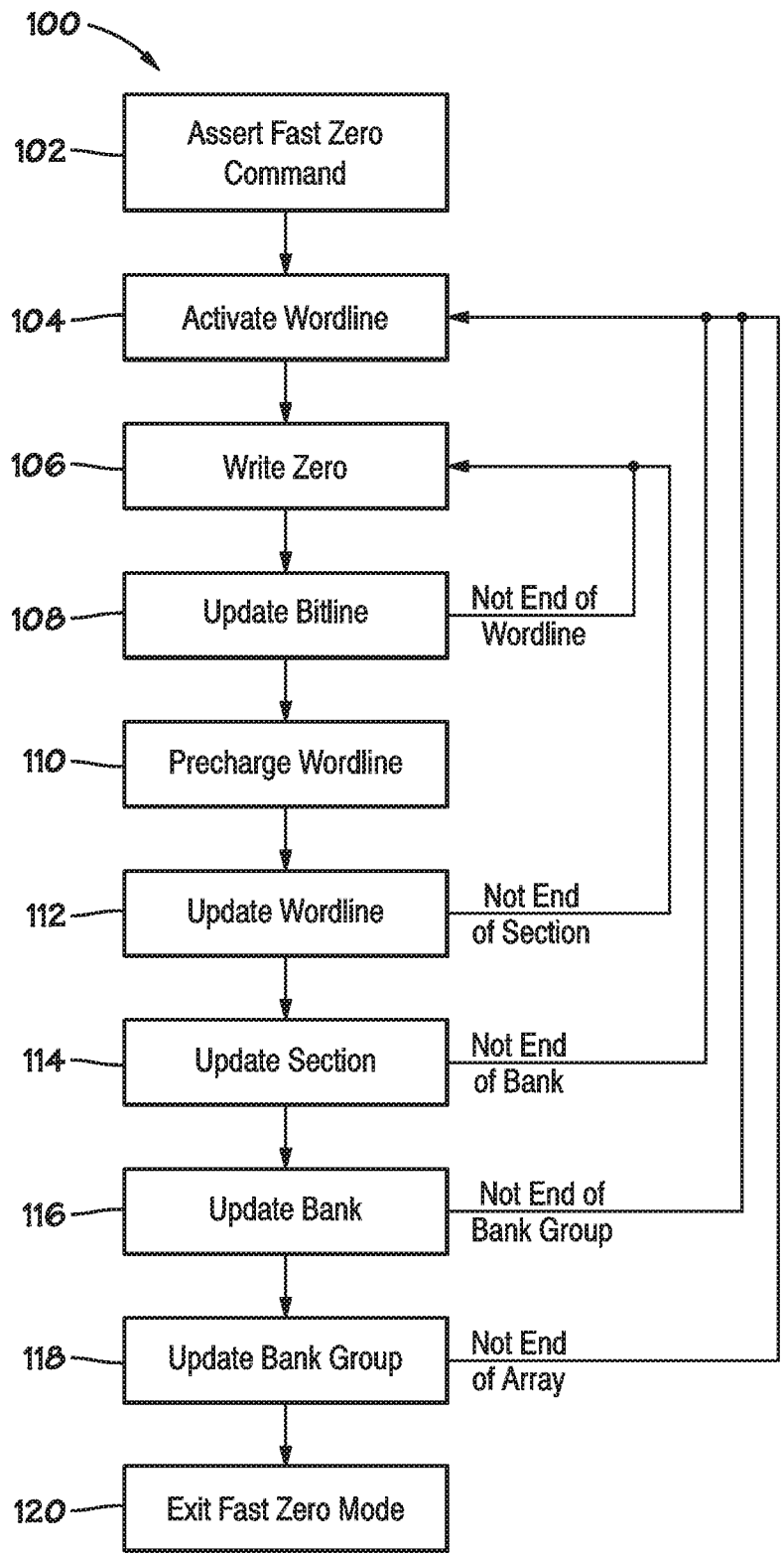
FIG. 5 is a flowchart illustrating a Fast Zero mode of operation, in accordance with an embodiment of the present disclosure.

Turning now to FIG. 5, a flowchart 100 illustrating an example implementation of the Fast Zero Mode is shown utilizing a column cycling method. The Fast Zero mode controller 80 may first receive a Fast Zero command 78 (process block 102). Upon receipt of the Fast Zero command 78, the Fast Zero mode controller 80 may issue an activate command to a wordline 62 of the memory array 22 (process block 104). Additionally, multiple (e.g., four) wordlines 62 may be activated simultaneously to further reduce overall process time. After activating at least one wordline 62, along with at least one bitline 64, a 0 may be written to a memory cell 66 (process block 106). Multiple bitlines 64 may be activated simultaneously in accordance with a column address. After writing a 0 to a memory cell 66 of the activated wordline(s) 62 the bitline(s) 64 may be updated, for example, by progressing to a subsequent column address (process block 108). The Fast Zero mode controller 80 and the column address counter 92 may be utilized to sequentially step through the bitlines 64 of the activated wordline(s) 62. Additionally, multiple bitlines 64, columns 68, and/or column addresses may activated simultaneously to further reduce overall process time. After sequencing through the bitlines 64, the activated wordline(s) 62 may be pre-charged to deactivate them (process block 110). The row address counter 90 may then update the process to subsequent wordlines 62 until the end of the section 60 is reached (process block 112).

At the end of a section 60, the section address counter 88 may update to a subsequent section 60 until the end of the bank 32 is reached (process block 114). At the end of the bank 32, the bank address counter 86 may update to a subsequent bank 32 until the end of the bank group (process block 116). At the end of the bank group, the bank group counter 84 may update to a subsequent bank group until the end of the memory array 22 (process block 118). Once the end of the memory array 22 has been reached or all of the desired memory cells 66 have been written, the Fast Zero mode may then be exited (process block 120).

Although the flowchart 100 is depicted in a particular order, in certain embodiments, steps may be reordered, altered, deleted, repeated, and/or occur simultaneously. Additionally, in some embodiments, multiple wordlines 62, bitlines 64, columns 68, sections 60, memory banks 32, and/or bank groups may be activated and written to simultaneously. For example, the first wordline 62 of the first section 60 of all memory banks 32 may be written to simultaneously. In some embodiments, each memory bank 32 may be activated and written to in parallel and, thus, neither a bank group counter 84 nor the bank address counter 86 need be incremented.

Figure 6:
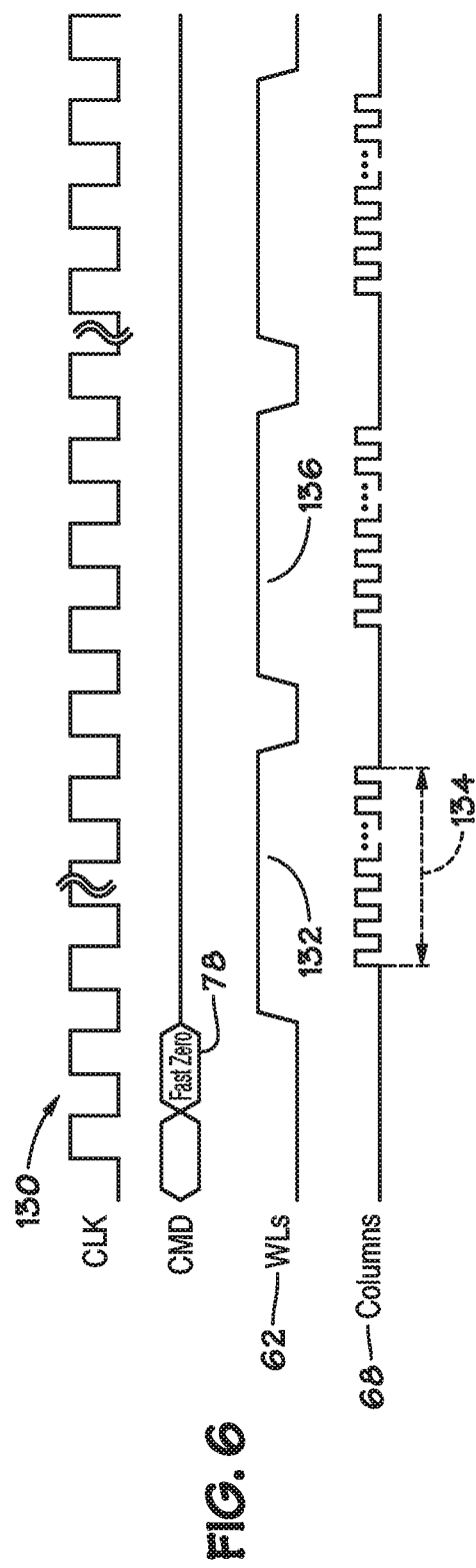
FIG. 6 is a timing diagram illustrating a Fast Zero mode of operation, in accordance with an embodiment of the present disclosure.

FIG. 6 illustrates one embodiment of a timing diagram 130 utilizing the column cycling method, as described in FIG. 5. Once the Fast Zero command 78 has been asserted, one or more wordlines 62 may be activated, as illustrated by pulse 132. While the wordline(s) 62 are activated, columns 68 may be cycled, as indicated by pulses 134, until the end of the wordline(s) 62 are reached (i.e., the end of the pulse 132). The first wordline(s) 62 may then be pre-charged or deactivated before the next wordline(s) 62 are activated, as indicated by pulse 136. This process may continue until the end of the section 60 is reached.

Figure 7:
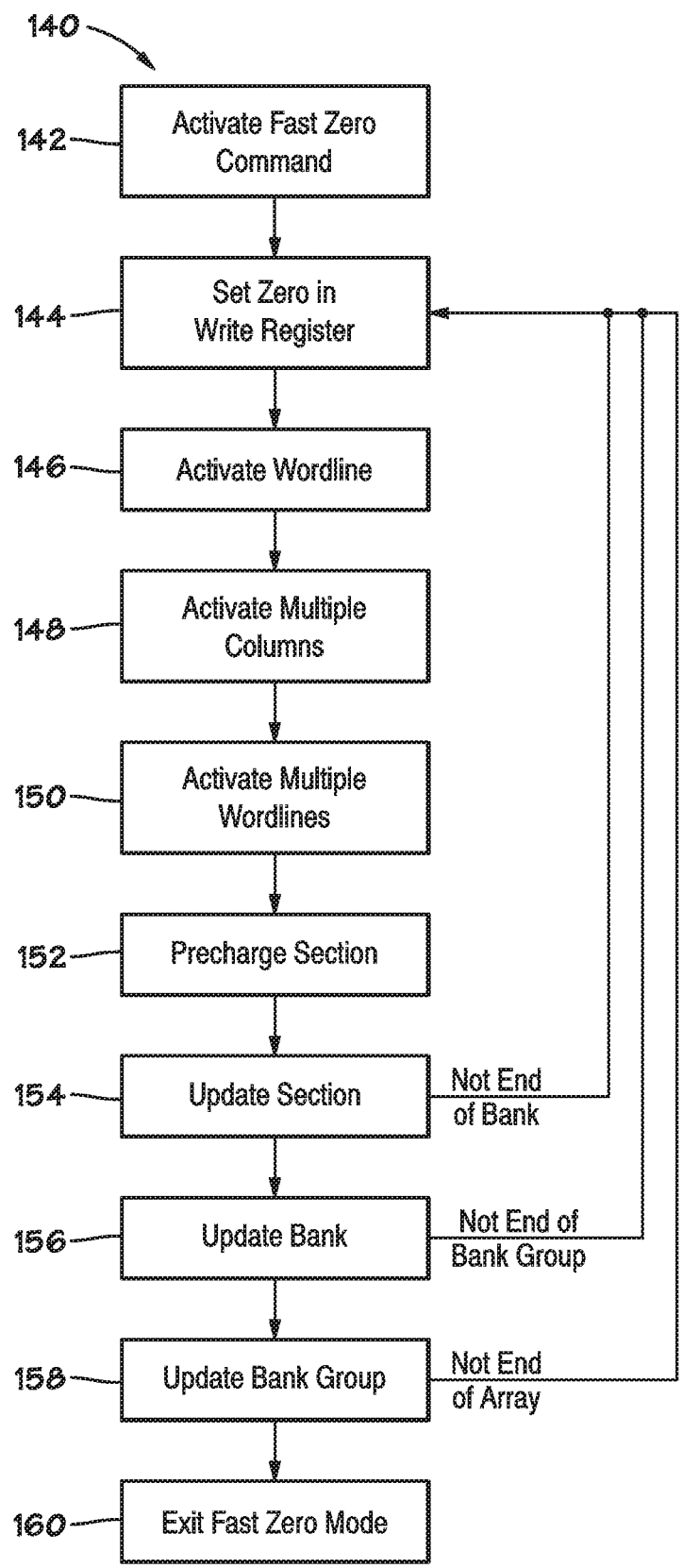
FIG. 7 is a flowchart illustrating a Fast Zero mode of operation, in accordance with another embodiment of the present disclosure.

In an alternative embodiment, illustrated by a flowchart 140 in FIG. 7, a method of row copying may be utilized to sequentially write 0s to the memory cells 66. Row copying may include activating one or more a wordlines 62, activating multiple bitlines 64 simultaneously, and activating subsequent wordlines 62 without pre-charging until the end of the section 60. The method may begin with activating the Fast Zero mode via a Fast Zero command 78 (process block 142). A logical 0 may then be set in a write register to be written to the memory cells 66 (process block 144). Additionally, one or more wordlines 62 may be activated (process block 146). Instead of cycling through each column 68 (e.g., one at a time), multiple columns 68 (e.g., all) may be activated at once, writing logical 0s to the multiple memory cells 66 of the wordline(s) 62 simultaneously (process block 148). As 0s are being written, the sense amplifier 70 of each bitline 64 may also be driven to 0. As other wordlines 62 are activated (process block 150), each may have 0s written to their memory cells 66 simultaneously. Because of the lack of pre-charge, the sense amplifiers 70 and/or the previously written memory cells 66 of each bitline 64 may assist in writing the newly activated wordlines 62 with logical 0s by sourcing or sinking current to or from the memory cell. In some embodiments, a slight pause may be employed between activation of new wordlines 62 to prevent overriding the sense amplifier 70. As more wordlines 62 are activated, they may be activated one at a time or in groups (e.g., 4 wordlines 62 at a time). When the end of the section 60 is reached, the section 60 may be pre-charged to deactivate the wordlines 62 and bitlines 64 (process block 152).

At the end of a section 60, the section address counter 88 may update to a subsequent section 60 until the end of the bank 32 is reached (process block 154). At the end of the bank 32, the bank address counter 86 may update to a subsequent bank 32 until the end of the bank group (process block 156). At the end of the bank group, the bank group counter 84 may update to a subsequent bank group until the end of the memory array 22 (process block 158). Once the end of the memory array 22 has been reached or all of the desired memory cells 66 have been written, the Fast Zero mode may then be exited (process block 160).

Although the flowchart 140 is depicted in a particular order, in certain embodiments, steps may be reordered, altered, deleted, repeated, and/or occur simultaneously. Additionally, in some embodiments, multiple wordlines 62, bitlines 64, columns 68, sections 60, memory banks 32, and/or bank groups may be activated simultaneously or one at a time. For example, the first wordline 62 of the first section 60 of all memory banks 32 may be written to simultaneously. In some embodiments, each memory bank 32 may be activated and written to in parallel and, thus, neither a bank group counter 84 nor the bank address counter 86 need be incremented.

Figure 8:
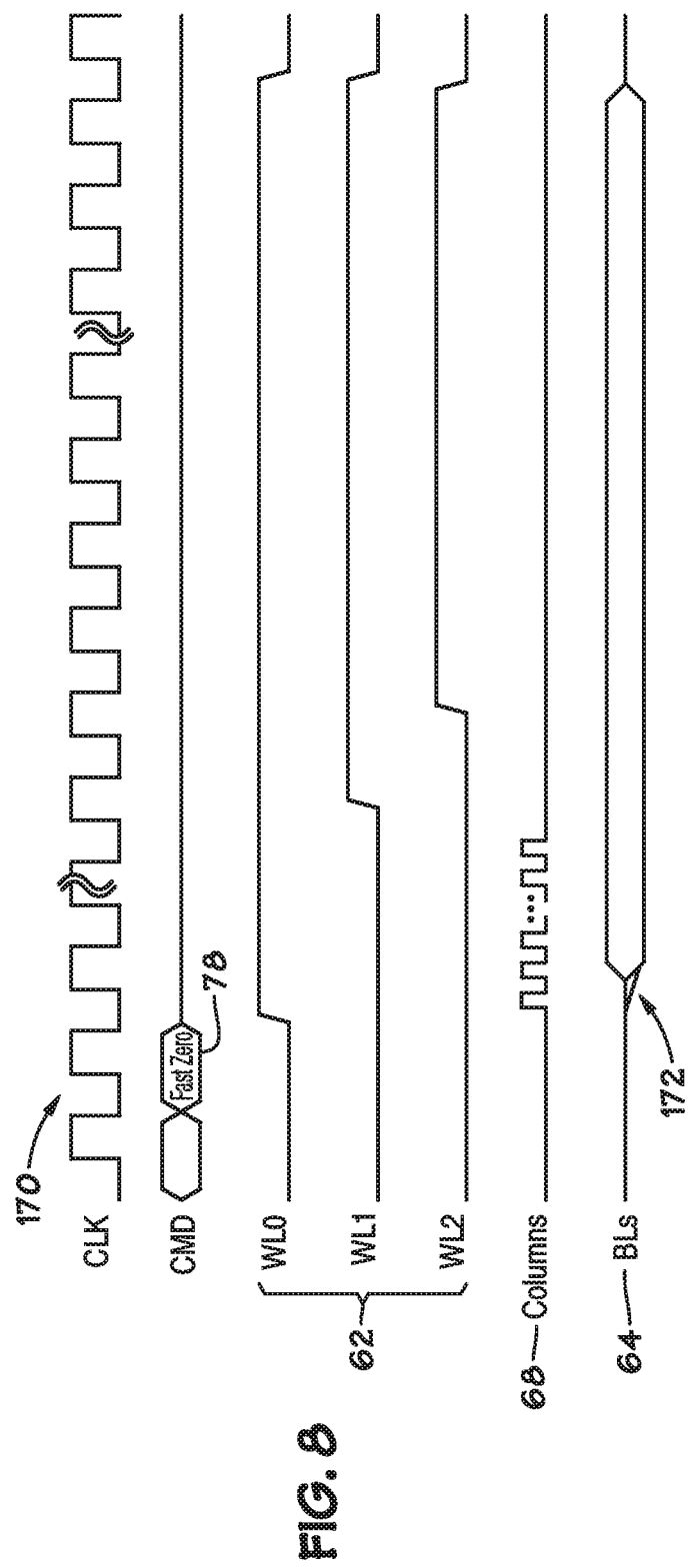
FIG. 8 is a timing diagram illustrating a Fast Zero mode of operation, in accordance with another embodiment of the present disclosure.

FIG. 8 illustrates one embodiment of a timing diagram 162 utilizing a row copy method, as described in FIG. 7. Once the Fast Zero command 78 has been asserted, a logical 0 may be set in the write register and one or more wordlines WL0 may be activated along with multiple (e.g., all) bitlines 64. While the first set of one or more wordlines WL0 is activated, the multiple bitlines 64 may be activated by activating one or more columns 68 in sequence, as depicted, or multiple (e.g., all) at once depending on the implementation. Because multiple bitlines 64 are being activated at once and a logical 0 has been already set in the write register, a delay 172 may occur before the sense amplifiers 70 of the multiple bitlines 64 are fully driven to 0. Once a 0 has been driven to the sense amplifiers 70, one or more other wordlines WL1 may then be activated. Because the wordline(s) WL0 and bitlines 64 were not pre-charged, and are, therefore, still active, the active wordline(s) WL0 may then be copied to the other wordline(s) WL1 without cycling though or reactivating the columns 68 again. Further wordlines WL2 may be activated until the end of the section 60 is reached. During the row copy method, the sense amplifiers 70 and/or the previously written memory cells 66 may assist in driving newly activated wordlines WL1 and WL2 and their associated memory cells 66 to logical 0. Because the columns 68 are activated during the first set of one or more wordlines WL0 and not pre-charged, writing the rest of the section 60 to logical 0 may not involve cycling though and/or reactivating the columns 68 multiple times. As such, the row copy method may lead to increased write speeds, and, therefore, faster operation of the Fast Zero mode. Depending on the implementation, activating multiple columns 68 and/or wordlines 62 simultaneously may increase current draw. As with the column cycling method, the logical 0s may be written to the memory array 22 without input from the I/O interface 36.

As described above, certain modes of operation, such as the Fast Zero mode, may facilitate sequential access to individual memory cells 66 of a memory array 22. The sequential access may be employed in multiple fashions that may be altered or combined. To facilitate this functionality, a command controller 28 may be provided, including one or more individual controllers to control the address sequencing when a particular mode entry command (e.g., Fast Zero command 78) is received. In order to generate internal addresses to be accessed sequentially, one or more counters 30 may also be provided.

While the current techniques may be susceptible to various modifications and alternative forms, specific embodiments have been shown by way of example in the drawings and have been described in detail herein. However, it should be understood that the current techniques are not intended to be limited to the particular forms disclosed. Rather, instead the present embodiments are intended to cover all modifications, equivalents, and alternatives falling within the spirit and scope of the present techniques as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A memory device comprising:
a memory array comprising a plurality of memory cells; and
one or more counters configured to cycle through internal memory addresses to sequentially access the plurality of memory cells and facilitate writing logical zeros to all of the plurality of memory cells, wherein writing the logical zeros to all of the plurality of memory cells comprises changing a logical one to a logical zero, wherein the one or more counters comprise a column address counter and a row address counter, wherein the row address counter is configured to generate internal row addresses to facilitate sequentially accessing a plurality of wordlines of the memory array, and wherein the column address counter is configured to generate internal column addresses to facilitate sequentially accessing a plurality of bitlines of the memory array, wherein the memory device comprises a dynamic random access memory device.

2. The memory device of claim 1, wherein the memory device comprises a command controller configured to receive one or more commands to initiate the writing of logical zeros and control the one or more counters.

3. The memory device of claim 2, wherein the one or more commands comprises a Fast Zero command to enter a Fast Zero mode.

4. The memory device of claim 3, wherein the Fast Zero command is a part of an error-correcting code (ECC) process.

5. The memory device of claim 1, wherein when at least one wordline of the plurality of wordlines of the memory array is activated, at least a portion of the plurality of bitlines is configured to be activated and deactivated in sequence until the end of the at least one wordline to facilitate writing logical zeros to the plurality of memory cells.

6. The memory device of claim 5, wherein the at least one wordline comprises four wordlines, wherein the four wordlines are configured to be activated simultaneously.

7. The memory device of claim 1, wherein the one or more counters comprise a section address counter.

8. The memory device of claim 1, wherein the one or more counters comprise a bank address counter.

9. The memory device of claim 1, wherein the one or more counters comprise a bank group counter.

10. The memory device of claim 1, wherein sequentially accessing the plurality of memory cells skips a reading of the plurality of memory cells.

11. The memory device of claim 1, wherein the memory device is configured to write logical zeros to the memory array without receiving the logical zeros from an input/output interface.

12. The memory device of claim 1, wherein the memory device comprises a double data rate synchronous dynamic random access memory device.

13. A system comprising:
a controller; and
a dynamic random access memory device communicatively coupled to the controller, wherein the dynamic random access memory device comprises:
a memory array comprising:
a plurality of wordlines; and
a plurality of bitlines, wherein an intersection of one of the plurality of wordlines and one of the plurality of bitlines comprises a memory cell;
a plurality of counters comprising a row address counter and a column address counter, wherein the row address counter is configured to generate internal row addresses to sequentially access the plurality of wordlines and the column address counter is configured to generate internal column addresses to sequentially access the plurality of bitlines to write the data pattern to the memory array, wherein writing the data pattern to the memory array comprises changing a previous logical value to a new logical value of the data pattern different from the previous logical value; and
a command controller configured to receive a Fast Zero command from the controller and facilitate writing a data pattern to at least one entire wordline of the memory array without receiving the data pattern from an input/output interface.

14. The system of claim 13, wherein the data pattern is all logical zeros.

15. The system of claim 13, wherein four of the plurality of wordlines are accessed and written to simultaneously.

16. The system of claim 13, wherein the one or more counters sequentially cycle through the plurality of bitlines, while at least one of the plurality of wordlines is accessed, to facilitate writing the data pattern.

17. A method, comprising:
- in response to the assertion of a command for entering a Fast Zero mode, accessing a wordline of a dynamic random access memory device;
- implementing a plurality of counters comprising a row address counter and a column address counter to generate internal memory addresses, wherein the column address counter is configured to generate internal column addresses to facilitate sequential access of a plurality of memory cells of the wordline via cycling through a plurality of bitlines, wherein the row address counter is configured to generate internal row addresses to facilitate sequential access of a second plurality of memory cells of a second wordline via cycling to the second wordline; and
- during access of the plurality of memory cells, writing logical zeros to the plurality of memory cells of the wordline of the dynamic random access memory device, wherein writing the logical zeros to the plurality of memory cells comprises changing a logical one to a logical zero.

18. The method of claim 17, wherein multiple of the plurality of wordlines are accessed and written to simultaneously.

19. The method of claim 17, wherein each of the plurality of counters is controlled by a command controller on the dynamic random access memory device.

* * * * *